(12) United States Patent
Mohammadi

(10) Patent No.: US 7,711,339 B2
(45) Date of Patent: May 4, 2010

(54) METHOD AND APPARATUS FOR PRODUCING A LOCAL OSCILLATOR SIGNAL

(75) Inventor: Behnam Mohammadi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 680 days.

(21) Appl. No.: 11/502,236

(22) Filed: Aug. 10, 2006

(65) Prior Publication Data

US 2008/0039027 A1 Feb. 14, 2008

Related U.S. Application Data

(60) Provisional application No. 60/818,880, filed on Jul. 6, 2006.

(51) Int. Cl.
*H04B 1/06* (2006.01)
(52) U.S. Cl. .................. 455/255; 455/260; 455/127.1; 455/118
(58) Field of Classification Search ......... 455/255–265, 455/313–334, 130–131, 118, 127.1
See application file for complete search history.

(56) References Cited

U.S. PATENT DOCUMENTS

| | | | | | |
|---|---|---|---|---|---|
| 6,584,157 | B1 * | 6/2003 | Van Der Zwan et al. | ..... | 375/247 |
| 7,342,461 | B1 * | 3/2008 | Wood | .......................... | 331/16 |
| 2004/0092245 | A1 * | 5/2004 | Katz | .......................... | 455/326 |
| 2006/0197655 | A1 * | 9/2006 | Luo et al. | .................... | 340/447 |
| 2008/0090519 | A1 * | 4/2008 | Rofougaran et al. | ........ | 455/41.1 |

\* cited by examiner

*Primary Examiner*—Lana N Le
(74) *Attorney, Agent, or Firm*—Brake Hughes Bellermann LLP.

(57) ABSTRACT

Methods and apparatus for providing a local oscillator (LO) signal are disclosed. An example apparatus includes a circuit for providing the LO signal. The circuit includes a voltage controlled oscillator (VCO) that is configured to operate at a first supply voltage. The VCO is also configured to produce a VCO signal. The circuit also includes an LO generator that is coupled with the VCO so as to receive the VCO signal. In the example apparatus, the LO generator is configured to operate at a second supply voltage, where the second supply voltage is greater than the first supply voltage. Further, the LO generator includes one or more resistively loaded circuits for producing the LO signal from the VCO signal.

18 Claims, 4 Drawing Sheets

METHOD AND APPARATUS FOR PRODUCING A LOCAL OSCILLATOR SIGNAL

CROSS REFERENCE TO RELATED APPLICATIONS

This application claims the benefit under 35 U.S.C. §119(e) of U.S. Provisional Patent Application Ser. No. 60/818,880, filed on Jul. 6, 2006. The entire disclosure of U.S. Provisional Application 60/818,880 is incorporated by reference herein in its entirety.

BACKGROUND

Wireless transceivers are used in a wide variety of wireless systems. A wireless transceiver may typically include a wireless receiver for receiving and demodulating signals, and a transmitter for modulating signals for transmission. Wireless transceivers and other communications circuits often include a local oscillator (LO) generator to generate an LO signal. Such an LO signal may be used with a mixer, for example, in a receiver portion of a transceiver to down-convert a received radio frequency (RF) signal to an intermediate frequency (IF). An LO generator may also be used by a transmitter portion of a transceiver (in combination with an RF power amplifier) to transmit a phase modulated (and/or amplitude modulated) RF signal. Of course, an LO generator may be used in other circuits as well. For various reasons (e.g., signal quality requirements of wireless communication protocols, such as phase noise requirements) certain components of LO generators are conventionally implemented using inductively loaded circuits. However, for transceivers implemented on integrated circuits, the inductors used to provide the loads for such circuits consume a considerable amount of circuit area (e.g., die area), which increases product cost.

The foregoing examples of the related art and limitations related therewith are intended to be illustrative and not exclusive. Other limitations of the related art may become apparent to those of skill in the art upon a reading of the specification and a study of the drawings.

SUMMARY

The following embodiments and aspects thereof are described and illustrated in conjunction with systems, tools and methods, which are given by way of example and meant to be illustrative, not limiting in scope. In various embodiments, one or more of the above-described problems have been reduced or eliminated, while other embodiments are directed to other improvements.

Various embodiments are disclosed relating to wireless systems, and also relating to local oscillator (LO) generators. In an example embodiment, a circuit for providing an LO signal includes a voltage controlled oscillator (VCO) that is configured to operate at a first power supply voltage. The VCO is also configured produce a VCO signal. The example circuit also includes an LO generator that is coupled with the VCO so as to receive the VCO signal. The LO generator is configured to operate at a second power supply voltage, where the second power supply voltage is greater than the first power supply voltage. In the example circuit, the LO generator may include one or more resistively loaded circuits for producing the LO signal from the VCO signal.

In another example embodiment, one or more resistively loaded circuits of an LO generator may include a first resistively loaded signal buffer that is AC-coupled with the VCO. The first resistively loaded signal buffer may be configured to receive the VCO signal and produce a first buffered VCO signal. The one or more resistively loaded circuits in this example embodiment may also include a second resistively loaded signal buffer that is coupled with the first resistively loaded signal buffer. The second resistively loaded signal buffer may be configured to receive the first buffered VCO signal and produce a second buffered VCO signal.

The one or more resistively coupled circuits may further include a resistively loaded frequency divider that is coupled with the first resistively loaded signal buffer. In the example embodiment, the resistively loaded frequency divider may be configured to receive the first buffered VCO signal and produce a frequency divided VCO signal.

Still further, the one or more resistively coupled circuits may include a resistively loaded multiplexer coupled with both the second resistively loaded signal buffer and the resistively loaded frequency divider. In this embodiment, the resistively loaded multiplexer may be configured to receive the second buffered VCO signal and also receive the frequency divided VCO signal. The multiplexer may be further configured to selectively produce one of a high-frequency LO signal and a low-frequency LO signal based, respectively, on a selected one of the second buffered VCO signal and the frequency divided VCO signal.

An example method of providing an LO signal may include producing a voltage controlled oscillator (VCO) signal using a VCO operating at first power supply voltage. The example method may further include providing the VCO signal to one or more resistively loaded circuits operating at a second power supply voltage, where the second power supply voltage is greater than the first power supply voltage. The example method may further include producing the LO signal from the VCO signal using the resistively loaded circuits, such as the resistively loaded circuits described above, for example.

BRIEF DESCRIPTION OF THE DRAWINGS

Example embodiments are illustrated in referenced figures of the drawings. It is intended that the embodiments and figures disclosed herein are to be considered illustrative rather than restrictive.

DETAILED DESCRIPTION

Wireless System Overview

Figure 1:
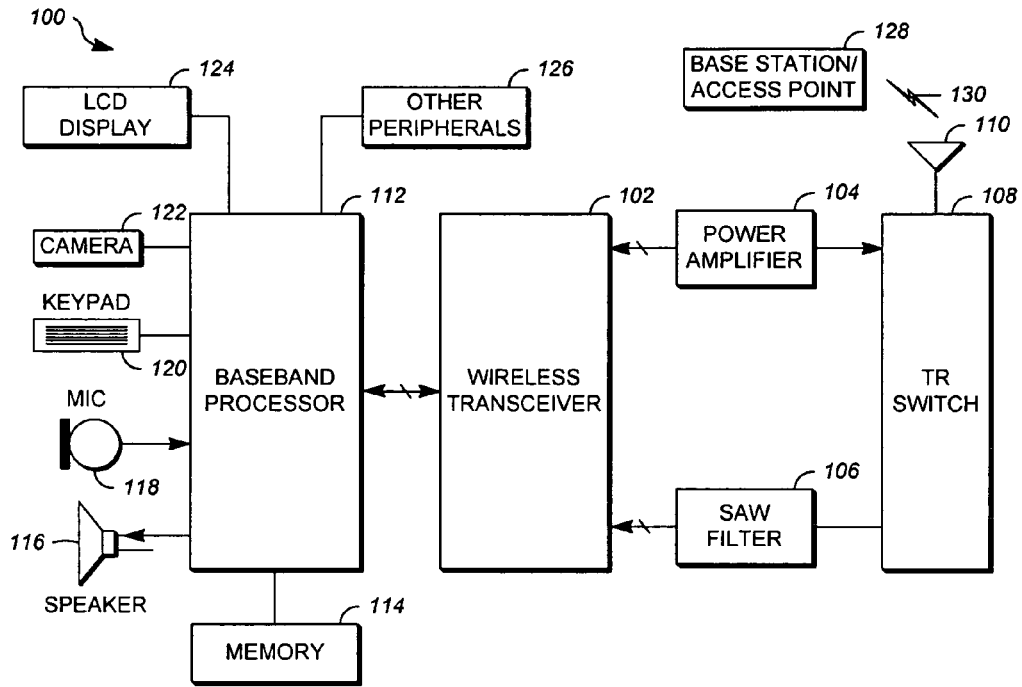
FIG. 1 is a block diagram illustrating an example wireless system.

FIG. 1 is a block diagram of a wireless system according to an example embodiment. Wireless system 100 may include a wireless transceiver (transmitter/receiver) 102 for transmitting and receiving radio or wireless signals. A baseband processor 112 can be coupled to wireless transceiver 102 to perform various types of processing and overall control of system 100. Baseband processor 112 may, of course, perform other tasks. Baseband processor 112 may include a controller, and may also include for example, an audio codec to process audio signals, a video or image processing codec (e.g., an MPEG4 compression and/or decompression module), and other components or blocks, not shown.

An antenna 110 may be provided to receive and transmit radio signals or electromagnetic signals. A transmitter/receiver (TR) switch 108 may select either a transmit mode or a receive mode for the antenna 110. Signals output by wireless transceiver 102 for transmission may be amplified by an amplifier 104 and then transmitted via antenna 110. Wireless transceiver 102 may also include an amplifier in addition to, or in place of amplifier 104. The particular configuration used in a given wireless system will depend on the particular embodiment.

Signals received via antenna 110 (such as via an air interface 130) may be filtered by a SAW (surface acoustic wave) filter 106 (or other filter) and then input to wireless transceiver 102. Using transceiver 102, the received signals may be processed or demodulated, which may include down-converting the signals to an intermediate frequency (IF) and then down-converting to baseband or other frequency, digital detection of data and other signal processing. Likewise, digital data to be transmitted (e.g., via air interface 130) may be received by wireless transceiver 102 from baseband processor 112. Wireless transceiver 102 may modulate the digital data from baseband processor 112 onto a selected channel or frequency (or range or spectrum of frequencies) for radio-frequency transmission via antenna 110.

Wireless signals may be communicated to and from wireless transceiver 102 (e.g., via power amplifier 104, SAW filter 106 and antenna 110) from a base station and/or access point (AP) 128 (hereafter AP 128) over the air interface 130. The wireless signals communicated between wireless transceiver 102 and AP 128 may be communicated using any number of communication protocols, such as the protocols discussed herein, for example. The wireless signals communicated between wireless transceiver 102 and AP 128 may include voice information, streaming media (audio and/or video), packet data (such as Internet Protocol packet data), or any other information that is suitable for communication using such wireless signals.

In wireless system 100, a variety of peripheral components may be coupled to baseband processor 112. For example, a memory 114, such as a Flash memory or Random Access Memory (RAM), may store information. A microphone 118 and speaker 116 may allow audio signals to be input to and output by wireless system 100, such as for a cell phone or other communications device. A keypad 120 may allow a user to input characters or other information to be processed by wireless system 100. A camera 122 or other optical device may be provided to allow users to capture photos or images that may be processed and/or stored by system 100 in memory or other storage location. Wireless system 100 may also include a display 124, such as a liquid crystal display for example, to display information (e.g., text and images). A variety of other peripheral components 126 (e.g., such as a memory stick, an audio player, a Bluetooth wireless transceiver, or a Universal Serial Bus (USB) port) may be coupled to baseband processor 112. These are merely a few examples of the types of devices and peripheral components that may be provided as part of wireless system 100 or coupled to baseband processor 112, and the disclosure is not limited thereto.

Wireless system 100 may be used in a variety of systems or applications, such as a mobile or cellular phone, a wireless local area network (WLAN) phone, a wireless personal digital assistant (PDA), a mobile communications device, or other wireless device. In an example embodiment, wireless system 100 may be capable of operating using a variety of transmit/receive frequencies or frequency bands and for a variety of different standards or communications protocols. Although not required, wireless system 100 may be a multi-band wireless system capable of transmitting or receiving signals on one of a plurality of frequencies or bands. For example, wireless system 100 may operate at or around 1900 MHz for WCDMA (Wide-Band Code Division Multiple Access) or PCS (Personal Communications Services), at or around 1800 MHz for DCS (Distributed Communication Services) (these frequencies may be considered an upper band of frequencies), at 850 MHz for GSM (Global System for Mobile communication), at or around 900 MHz for EGSM (Extended GSM) (these frequencies may be considered a lower band of frequencies). These are merely some example frequencies, and the system 100 may operate at many other frequencies and in accordance with any number of communication standards.

Example Wireless Transceiver

Figure 2:
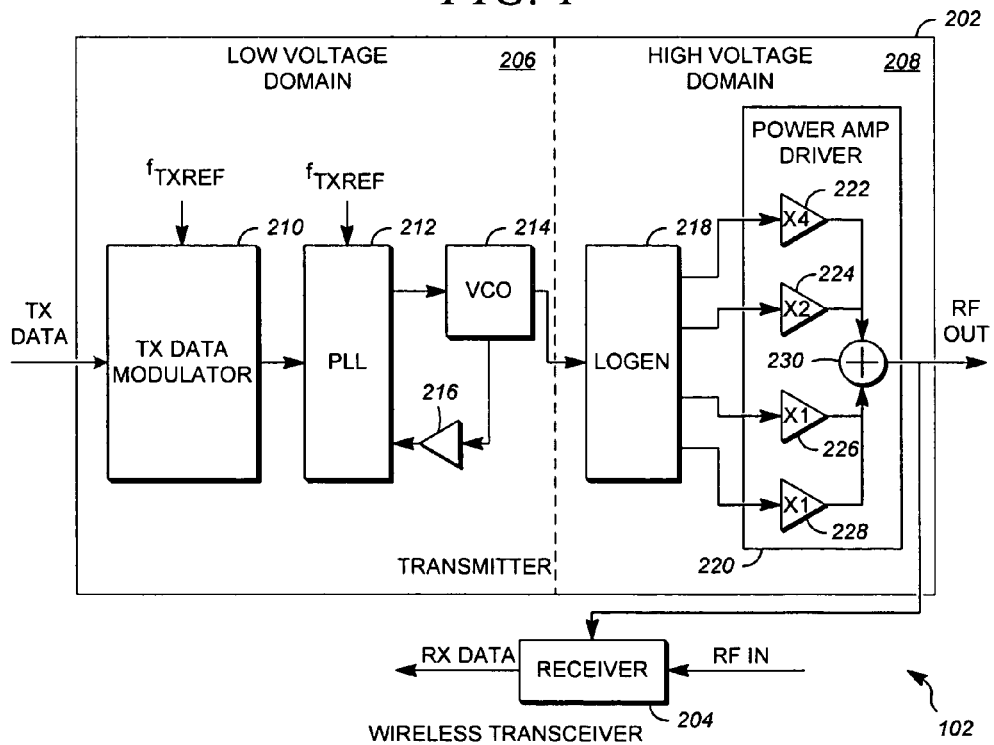
FIG. 2 is a block diagram illustrating an example wireless transceiver that may be implemented in the wireless system of FIG. 1.

FIG. 2 is a block diagram of a wireless transceiver according to an example embodiment. Wireless transceiver 102 may include a transmitter 202 to modulate and transmit data, and a receiver 204 to receive and demodulate data. Receiver 204 may take any number of forms, such as a quadrature receiver, for example. The particular configuration used for receiver 204 will depend on the particular embodiment of wireless transceiver 102 and/or wireless system 100.

Briefly, receiver 204 may receive a modulated RF signal (e.g., an in-phase (I) signal and a corresponding quadrature phase (Q) signal), designated "RF In" in FIG. 2. Receiver 204 then may process the "RF In" signal to extract data (e.g., baseband data) from the modulated "RF In" signal. The extracted data is designated "RX Data" in FIG. 2.

The signal processing implemented by the receiver 204 may include down conversion of the "RF In" signal to an intermediate frequency (IF) signal (e.g., I and Q IF signals). The receiver 204 may also further process the IF signal or signals to produce a baseband signal or signals. A digital signal processor included in receiver 204 may be used to implement this further signal processing, for example. As a result of processing the "RF In" signal or signals, receiver 204 may produce an extracted data signal (e.g., "RX Data"). The "RX Data" signal may then be provided to, for example, baseband processor 112 in system 100 for additional processing (e.g., audio and/or video processing).

As shown in FIG. 2, the transmitter 202 of wireless transceiver 102 includes a low voltage domain 206 and a high voltage domain 208. In this particular embodiment, transmitter 202 includes circuits operating in both the low voltage domain 206 and the high voltage domain 208. As will be discussed in further detail below, the use of two voltage domains allows for producing an LO signal using resistively loaded circuits, as opposed to inductively loaded circuits. Such resistively loaded circuits may allow for significant reductions in the amount of circuit area (e.g., die area) physically used on a chip for wireless transceiver 102 as compared to embodiments using inductively loaded circuits. For instance, the use of a resistively loaded circuit may allow for a five to ten time reduction in circuit area as compared with an analogous inductively loaded circuit.

As was indicated above, such reductions in circuit area are desirable as they may translate directly to reductions in product cost. Furthermore, using resistively loaded circuits that operate in the high voltage domain 208, such as the circuits described herein, these reductions in circuit area may be achieved without substantially increasing phase noise that is introduced during LO signal generation, as compared to a transceiver that is implemented with inductively loaded circuits operating in a single voltage domain.

In the low voltage domain 206, the transmitter 202 of wireless transceiver 102 includes a transmit (TX) data modulator 210. The TX data modulator 210 may receive digital data that is to be transmitted by wireless transceiver 102. This transmit data is designated "TX Data" in FIG. 2. Data modulator 210 may then modulate the "TX Data" using a transmit reference frequency ($f_{TXREF}$). The transmit reference frequency $f_{TXREF}$ may be generated in any number of ways. For example a crystal oscillator may be used in conjunction with a frequency synthesizer to generate $f_{TXREF}$. To accommodate different frequencies and different channels for various wireless communication protocols, the transmit reference frequency, $f_{TXREF}$, may be a generated as a variable frequency. The range of frequencies of $f_{TXREF}$ will depend on the particular embodiment. For instance, the communication protocols implemented in such embodiments may include CDMA (Code Division Multiple Access), WCDMA (Wideband CDMA), GSM (Global System for Mobile Communications), EGSM (Extended GSM), Blue Tooth (BT), one or more Wi-Fi standards, such as IEEE 802.11a, 802.11b, 802.11g, or other 802.11 standard, Wi-Max (e.g., 802.16), etc.

In an example embodiment, transmitter 202 (e.g., using TX data modulator 210) may modulate the "TX Data" using a variety of techniques, such as Phase Shift Keying (PSK) (e.g., 8PSK, etc.). Data modulator 210 may alternatively modulate the received "TX data" using phase modulation or frequency modulation, or variations thereof, such as Gaussian-Filtered Minimum Shift Keying (GMSK), or the like. According to an example embodiment, for such a phase modulation or frequency modulation or GMSK modulation, or the like, the amplitude of the signal output by transmitter 202 may be, for example, set to a constant amplitude or level.

The TX Data modulator 210 may then provide the modulated "TX Data" to a phase locked loop circuit (PLL) 212 that operates in the low voltage domain 206. In the embodiment illustrated in FIG. 2, the PLL 212 also operates based on the transmit reference frequency, $f_{TXREF}$. In certain embodiments, the operating frequency of the PLL 212 may be modulated using a delta-sigma modulator (not shown).

For wireless transceiver 102, the PLL 212 operates in conjunction with a voltage controlled oscillator (VCO) 214. The VCO 214 also operates in the low voltage domain and, in conjunction with the PLL 212, generates a VCO signal (e.g., a differential VCO signal). The VCO signal may be a phase modulated signal that includes the modulated "TX Data" provided to the PLL 212 by the TX data modulator 210. It will be appreciated that the signals produced by the various circuits of the transmitter 202 may be differential signals and that each of the circuits of the transmitter 202 may be differential circuits.

The transmitter 202 further includes a signal buffer 216 that provides a buffered version of the VCO signal to the PLL for use in feedback control to control (e.g., lock) the frequency and phase of the VCO signal produced by the VCO 214. The buffer 216 may be a resistively loaded signal buffer that is AC coupled with the VCO 214. The buffer 216 can be AC coupled with the VCO to adjust the common mode voltage of the VCO signal with the common mode voltage of the buffer 216. Depending on the particular embodiment, phase noise requirements for such a feedback control signal may be less stringent than the phase noise requirements for a transmitted (e.g., RF) signal. Accordingly, a resistively loaded buffer operating in the low voltage domain, such as the buffer 216, may provide sufficient signal quality for such a feedback control signal.

The buffer 216 may also provide isolation between the VCO 214 and the PLL 212. For instance, the buffer 216 may present a substantially constant load to the output of the VCO 214. For instance, were the buffer 216 not included in the transmitter 202, the load presented to the output of the VCO 214 may be time varying (e.g., due to changes in the operating conditions of the PLL). Such a time varying load is undesirable as it may adversely affect the phase and/or frequency of the VCO signal produced by the VCO 214. Additionally, depending on the particular embodiment, the buffer 216 may include circuitry that allows the buffer 216 to be disabled, such as during a standby or low power mode of the wireless system 100. Example embodiments of such circuitry are described herein in with respect to, for example, transceiver circuits that include an LO generator.

In an example embodiment, the frequency and phase of the VCO signal produced by the VCO 214 may depend on a selected channel for a selected band of service. For instance, the VCO signal may include an approximately 2 GHz signal to support "upper band" wireless communication protocols (e.g., WCDMA). Such a VCO signal may be frequency divided to provide an approximately 1 GHz signal, such as described below, to support "lower band" wireless communications (e.g., GSM). These are merely example frequencies and any number of other frequencies may be used.

By way of example, the AP 128 of FIG. 1 may assign the wireless system 100 a channel to use for data transmission. The VCO 214 may then output a range of frequencies or a modulated frequency spectrum corresponding with the selected channel, where the TX data is modulated onto the frequency spectrum output by the VCO 214.

The frequency spectrum output by the VCO 214 then may be provided to an LO generator 218 that operates in a high voltage domain 208 of the transmitter 202. The supply voltages for the low voltage domain 206 and the high voltage domain 208 of the transmitter 202 may depend on the particular embodiment. For instance, in an example embodiment, the power supply voltage for the low voltage domain 206 may be 1.5 V, while the power supply voltage for the high voltage domain may be 2.8 V. Of course, other supply voltages may be used.

It is noted that, in certain embodiments, implementing the LO generator 218 in the high voltage domain 208, as shown in FIG. 2, may not result in a substantial increase in power consumption as compared to embodiments that implement such an LO generator (e.g., using inductively loaded circuits) in a low voltage domain, such as low voltage domain 206. For instance, in a system implemented using a voltage regulator (e.g., a regulator operating at 5 V) to supply the power supply voltages for the low voltage domain 206 and the high voltage domain 208, any additional power consumed by the LO generator 218 operating in the high voltage domain 208 may be offset by a corresponding reduction in power consumed in the voltage regulator used to supply the power supply voltage for the high voltage domain 208. As discussed above, such resistively loaded circuits may have an area that is five to ten times less than comparable inductively loaded circuits.

Implementing the LO generator 218 in the high voltage domain 208 provides additional voltage headroom for the circuits included in the LO Generator 218. Briefly, this additional voltage headroom allows for the use of resistively loaded circuits in place of inductively loaded circuits in the LO generator 218 without substantially increasing the size of the current sources included in the circuits. Without this increased headroom, larger current sources would be used in such resistively loaded circuits to compensate for the voltage drop across the resistive loads. Such increases in the size of the current sources would result in increased phase noise, which is undesirable as it may result in signals produced by the transmitter 202 that do not comply with signal quality requirements for certain wireless communication protocols (e.g., GSM).

As shown in FIG. 2, the LO Generator 218 may provide four signals to an RF power amplifier driver (PAD) 220. In wireless transceiver 102, PAD 220 may include a plurality of binary weighted amplifier sections 222, 224, 226, 228. The relative weights of the sections are designated, respectively as 'X4', 'X2', 'X1' and 'X1.' It will be appreciated that other approaches for weighting such amplifier sections may be used. Further, additional or fewer amplifier sections may be included in PAD 220.

The amplifier sections 222, 224, 226, 228 may be enabled and/or disabled to control the amount of RF transmission power of an "RF Out" signal produced by the transmitter 202. The signals produced by the enabled amplifier sections at any given time may be combined using combiner 230 to produce the "RF Out" signal. The particular techniques used to implement power control in PAD 220 will depend on the particular embodiment and the particular wireless protocol being implemented by wireless transceiver 102.

In the transmitter 202, the LO generator 218 may include a circuit (e.g., a multiplexer circuit) that includes a plurality of buffer sections. For this embodiment, each of the plurality of buffer sections may correspond respectively with one of the amplifier sections 222, 224, 226, 228 of PAD 220. Such a multiplexer circuit is described in further detail below with reference to FIGS. 3 and 6. Briefly, however, when performing transmission power control for wireless transceiver 102, the individual buffer sections of such a multiplexer circuit may be enabled and/or disabled in correspondence with the enabled/disabled amplifier sections 222, 224, 226, 228. Such an approach (e.g., disabling buffer sections corresponding with disabled amplifier sections) may reduce signal "feed-through" in PAD 220. Such a reduction in signal feed-through may improve the quality of the "RF Out" signal, including a reduction in the amount of phase noise introduced by the LO generator 218.

LO Generator

Figure 3:
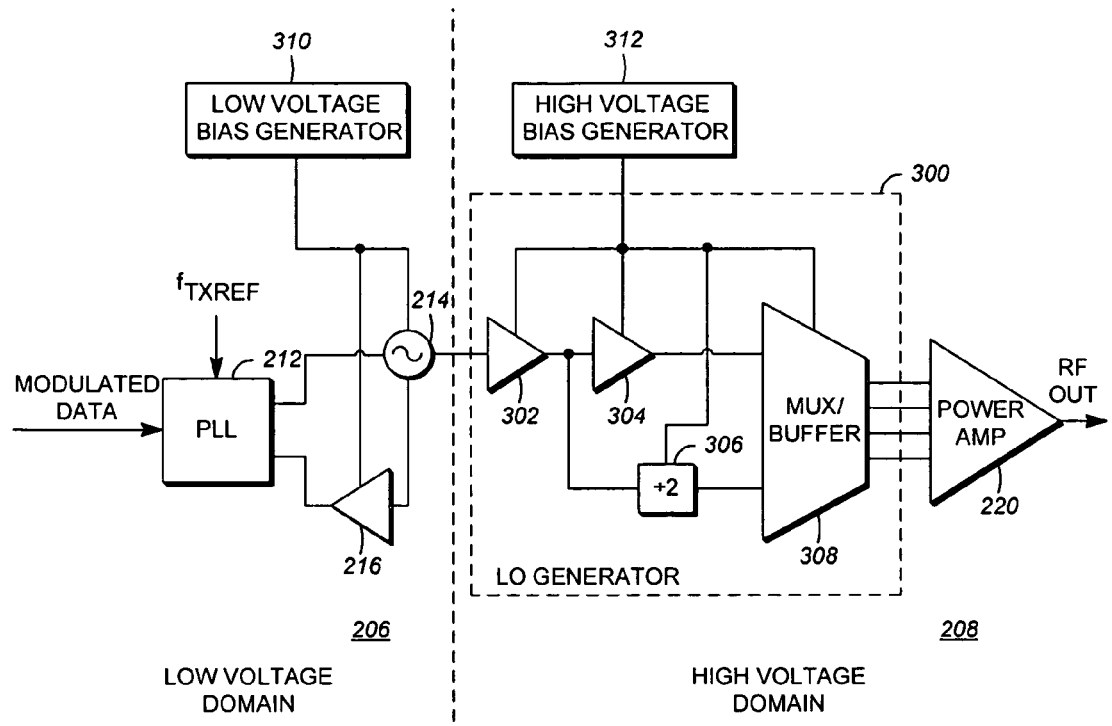
FIG. 3 is a block diagram illustrating a portion of the wireless transceiver of FIG. 2 in further detail, including a local oscillator (LO) generator.

FIG. 3 is a block diagram illustrating a portion of the transmitter 202 of FIG. 2 that shows a more detailed example embodiment of an LO generator 300. The LO generator 300 may be implemented in the transmitter 202 of FIG. 2 as LO generator 218. Of course, other embodiments of LO generators may be used.

The portion of the transmitter 202 illustrated in FIG. 3 includes corresponding elements from FIG. 2. These corresponding elements are referenced with like reference numbers and include PLL 212, VCO 214, signal buffer 216 and PAD 220. FIG. 3 also illustrates the portions of the transmitter 202 that operate in the low voltage domain 206 and the high voltage domain 208 in correspondence with FIG. 2. For purposes of brevity and clarity, like elements of FIGS. 2 and 3 are not discussed in detail again here, except as needed to explain the elements of the LO generator 300.

As shown in FIG. 3, the LO generator 300 operates in the high voltage domain 208 and includes a first resistively loaded signal buffer 302, a second resistively loaded signal buffer 304, a resistively loaded frequency divider 306 and a resistively loaded MUX/Buffer 308. Each of these circuits will be described in further detail below.

It will be appreciated that digital signals may be generated in the low voltage domain 206 then may be provided to each of the circuits LO generator 300 operating in the high voltage domain 208. These digital signals may include control signals, such as power-down signals, for example. For such signals, level shifters may be used to convert the low voltage domain 206 digital signals to high voltage domain 208 digital signals. Such level shifters are known and are not shown or discussed in detail here.

Referring to signal buffer 302, as was discussed above with respect to the signal buffer 216, the signal buffer 302 may be AC-coupled with the VCO 214 so as to adjust the common mode voltage of the VCO signal provided to the LO generator 300 to match the common mode voltage of the signal buffer 302. The signal buffer 302 may receive the VCO signal including modulated TX Data, adjust the common mode voltage of the VCO signal and produce a first buffered VCO signal (e.g., a differential signal).

The signal buffer 302, in similar fashion as the signal buffer 216, provides isolation for the output of VCO 214 from the other elements of the LO generator 300, as well as PAD 220. As with the signal buffer 216, the signal buffer 302 presents the output of the VCO 214 with a substantially constant load. This may be advantageous, as the isolation provided by the signal buffer 302 may reduce "frequency pulling" (e.g., undesirable frequency shifts) that could otherwise result during power control in PAD 220, as well as other loading effects caused by the other elements of the LO generator 300. In the absence of such isolation, frequency pulling may occur due to changes in capacitance presented to the VCO output that are caused by enabling and disabling amplifier sections of PAD 220, corresponding buffer sections in the MUX/Buffer 308 can disable the signal buffer 304 or the frequency divider 306. Signal buffer 304, frequency divider 306 and MUX/Buffer 308 are discussed in further detail below with reference to FIGS. 3-6.

The second resistively loaded signal buffer 304 is coupled with the first resistively loaded signal buffer 302. The signal buffer 304 may be designed to have the same common mode voltage as the signal buffer 302. In such an embodiment, the signal buffer 304 would not be AC-coupled with the signal buffer 302. Such an approach may reduce the number of circuit elements (e.g., capacitors) included in the signal buffer 304 as compared to the signal buffer 302. The second resistively loaded signal buffer 304 may receive the first buffered VCO signal from the signal buffer 302 and produce a second buffered VCO signal that is then provided to the MUX/Buffer 308 for producing upper band LO signals. For instance, as discussed above with regard to VCO 214, the second buffered VCO signal may be a signal in the 2 GHz range for generating LO signals for upper band wireless communication protocols.

The resistively loaded frequency divider 306 (a divide by two frequency divider in this example) is also coupled with the first resistively loaded signal buffer 302. As with the signal buffer 304, the frequency divider 306 may be designed to have the same common mode voltage as the signal buffer 302 and, thus, would not be AC-coupled with the signal buffer 302, thereby eliminating the use of AC coupling capacitors. Such capacitors may consume a substantial amount of circuit area.

The frequency divider 306 may receive the first buffered VCO signal and produce a frequency divided VCO signal that is then provided to the MUX/Buffer 308 for producing lower band LO signals. For instance, the frequency divided VCO signal may be a signal in the 1 GHz range for generating LO signals for lower band wireless communication protocols (e.g., GSM), as previously described.

Depending on whether a selected channel over which the transmitter 202 is to communicate wireless signals is an upper band channel or a lower band channel, either the signal buffer 304 or the frequency divider 306 may be disabled, so as to prevent feed through of the unneeded signal in the MUX/Buffer 308. For instance, if a WCDMA channel (e.g., an upper band channel) is selected for communicating wireless signals, the signal buffer 304 may be enabled while the frequency divider 306 may be disabled. This approach would prevent feed through of the divided VCO signal in the MUX/Buffer 308 (e.g., to PAD 220) when communicating on an upper band communication channel. Example techniques for disabling the signal buffer 304 are discussed in further detail below. Such techniques may also be applied to disable other circuit of the transmitter 202, such as the signal buffer 216 and the frequency divider 306.

The resistively loaded MUX/Buffer 308 is coupled with both the second resistively loaded signal buffer 304 and the resistively loaded frequency divider 306. In Like fashion as with the signal buffers 302, 304 and the frequency divider 306, the MUX/Buffer 308 may be designed to have the same common mode voltage as the signal buffer 304 and the frequency divider 306, thereby eliminating the use of AC coupling capacitors in the MUX/Buffer 308.

The MUX/Buffer 308 may selectively receive the second buffered VCO signal or the frequency divided VCO signal (e.g., depending on a selected channel for communicating wireless signals, as described above). The MUX/Buffer 308 then selectively produces either a high-frequency LO signal (in the event an upper band channel is selected) or a low-frequency LO signal (in the event a lower band channel is selected). In this example, high frequency LO signals are produced based on the second buffered VCO signal produced by the signal buffer 304, while low frequency LO signals are produced based on the frequency divided LO signal produced by the frequency divider 306.

As was discussed above with respect to FIG. 2, the MUX/Buffer 308 may include a plurality of buffer sections that correspond, respectively, with a plurality of amplifier sections in PAD 220. Each of these sections may be configured so as allow for disabling a portion of a given buffer section based, for example, on a selected communication channel (e.g., upper band or lower band). The buffer sections of MUX/Buffer 308 may also be configured to allow for each section to be disabled as a whole based, for example, on a given power control configuration for PAD 220. For example, each buffer section of the MUX/Buffer 308 may be enabled or disabled in correspondence with the state(enabled or disabled) of a respective amplifier section in the given power control configuration. An example buffer section of the MUX/Buffer 308 is described below with reference to FIG. 6.

As is also shown in FIG. 3, the transmitter 202 of wireless transceiver 102 may include a low voltage bias generator 310 for providing the first supply voltage to the PLL 212, the VCO 214 and the signal buffer 216. Additionally, as shown in FIG. 2, the transmitter 202 may include a high voltage bias generator 312 for providing the second supply voltage to the resistively loaded circuits of the LO generator 300. The bias generators 310 and 312 may take any number of forms. For example, the bias generators 310 and 312 may be current mirrors that operate based on bandgap reference circuits. Alternatively, the bias generators 310 and 312 may be cascoded bias generators. The bias generators 310 and 312 may each include an RC filter (e.g., low pass filter) to reduce noise. Such filters typically include large capacitors that consume a substantial amount of circuit area. Therefore, it may be desirable to use a single low voltage bias generator 310 for the circuits of the low voltage domain 206 in the wireless transceiver 102 and a single high voltage bias generator 312 for the circuits of the LO generator 300. In certain embodiments, the PAD 220 may also be powered by the voltage bias generator 312.

Example LO generator circuits

Figure 4:
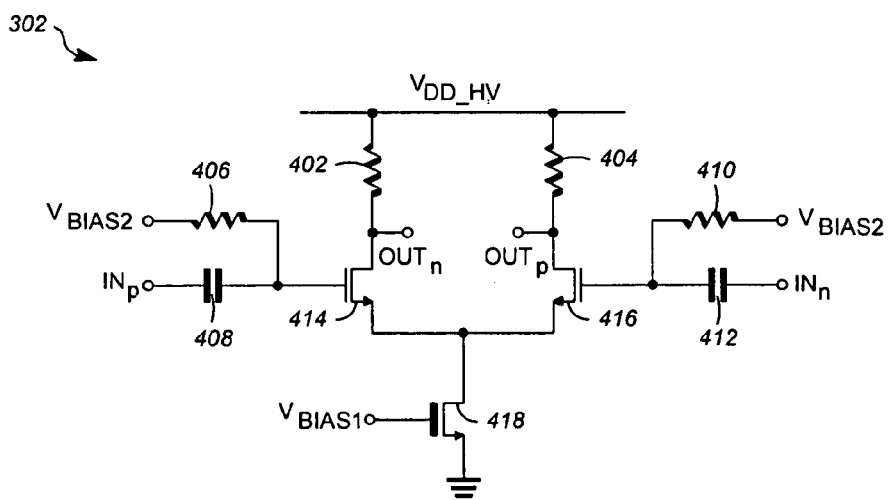
FIG. 4 is a circuit schematic of a first resistively loaded signal buffer of the LO generator illustrated in FIG. 3.

FIG. 4 is a circuit schematic diagram illustrating an example embodiment of the resistively loaded signal buffer 302 of the LO generator 300. The circuit illustrated in FIG. 4 is given by way of example and other circuit implementations are possible for the signal buffer 302. As shown in FIG. 4, the signal buffer 302 is powered by a "high-voltage" power supply (VDD_HV). This high-voltage power supply may be provided, for example, by the high voltage bias generator 312 shown in FIG. 3.

The signal buffer 302 includes load resistors 402 and 404, input bias resistors 406 and 410, AC coupling input capacitors 408 and 412, a differential transistor pair (including transistors 414 and 416) and a current source 418. In this particular embodiment, the current source 418 is implemented as a high-voltage transistor. Of course, use of a high voltage transistor is not required as this is merely an example circuit.

As has been previously described, the load resistors 402 and 404 of the signal buffer 302 are used in place of inductive loads used in previous circuits. However, were such inductive loads simply replaced with the resistors 402 and 404, the size of the current source 418 would need to be increased to account for the voltage drop across the resistors 402 and 404. As is know, inductors have substantially zero voltage drop across them at DC (e.g., inductors appear as a short to direct current). Therefore, simply replacing inductive loads in such a circuit with the resistors 402 and 404 would decrease the amount of supply voltage applied to the differential pair transistors 414 and 416. Increasing the size of the current source 418 may account for this voltage drop. However, because the current source 418 is a significant source of phase noise in the LO generator 300, increasing its size may result in the wireless transceiver 102 being unable to meet the stringent phase noise requirements of certain wireless communication protocols, such as GSM, for example.

The use of a high-voltage power supply for the signal buffer 302 provides voltage "headroom" in the signal buffer 302 to allow the resistors 402 and 404 to replace the inductive loads of previous circuits. For instance, the increased power supply voltage may compensate for the voltage drop across the load resistors 402 and 404 without any substantial increase in the size of the current source 418.

Also, in certain embodiments, the differential pair transistors 414 and 416 (n-type (FETs) field effect transistors) may be implemented as deep N-well devices. Such deep N-well transistors have their source connected with their bulk and, therefore, do not experience the body effect of typical n-type FETs. Such an approach may further increase the headroom for signal buffer 302 as such deep N-well transistors may have lower thresholds and, therefore, lower drain to source voltage drops. This additional headroom may allow for further improvements in phase noise performance, as the size of the current source 418 may be adjusted accordingly. The current source 418 is biased with a voltage bias $V_{bias1}$, which may be generated in any number of ways, such as using a bandgap reference circuit and/or a cascoded bias generator, for example.

The signal buffer 302 may receive the VCO signal, from the VCO 214 of transmitter 202 at the terminals designated $In_p$ and $In_n$. As was discussed above, the VCO signal in this embodiment may be a differential signal with the inverted portion being provided to the $In_n$ terminal and the non-inverted portion being provided to the $In_p$ terminal. An input bias ($V_{bias2}$) for AC coupling the signal buffer 302 with the VCO 214 may be applied via input bias resistors 406 and 408. The input bias voltage $V_{bias2}$ (via resistors 406 and 408), in conjunction with the AC-coupling capacitors 408,412 may adjust the common mode voltage of the differential VCO signal to match the common mode voltage of the signal buffer 302, as was previously discussed.

The first buffered VCO (differential) signal may then be provided at output terminals designated $Out_p$ and $Out_n$, where the non-inverted portion is provided on the $Out_p$ terminal and the inverted portion is provided on the $Out_n$ terminal. As was previously described, the first buffered VCO signal may then be provided to a second signal buffer 304 and a frequency divider 306. For purposes of brevity and clarity, the resistively loaded frequency divider 306 is not described in detail here as such circuits are known. It is noted, however, that the current source in the frequency divider 306 for the LO generator 300 may be implemented as a high voltage transistor, in similar fashion as the current source 418 in the signal buffer 302.

Figure 5:
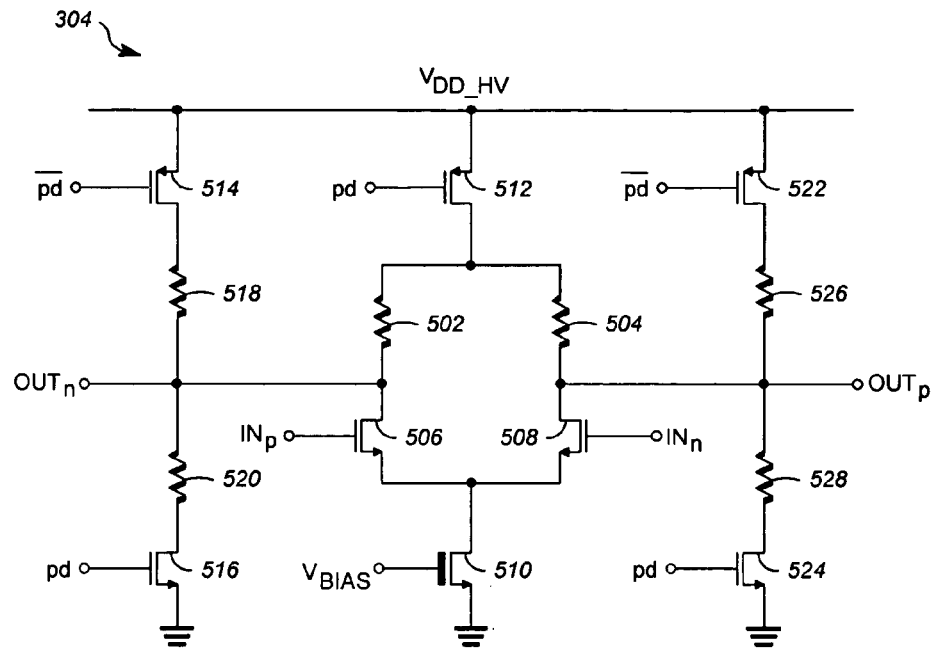
FIG. 5 is a circuit schematic of a second resistively loaded signal buffer of the LO generator illustrated in FIG. 3.

FIG. 5 is a circuit schematic diagram illustrating an example embodiment of the resistively loaded signal buffer 304 of the LO generator 300. As with FIG. 4, the circuit illustrated in FIG. 5 is given by way of example and other circuit implementations are possible for the signal buffer 304. In like fashion as the signal buffer 302 shown in FIG. 4, the signal buffer 304 shown in FIG. 5 is powered by a "high-voltage" power supply (VDD_HV), such as may be provided, for example, by the high voltage bias generator 312 described with respect to FIG. 3.

In like fashion as the signal buffer 302, the signal buffer 304 can include load resistors 502 and 504, a differential transistor pair (e.g., including deep N-well transistors 506 and 508) and a current source 510 implemented as a high voltage transistor and biased with a voltage bias $V_{bias1}$. Because the signal buffer 304 is not AC coupled with the signal buffer 302 (e.g., they have the same common mode voltage), the signal buffer 304 need not include input bias resistors or AC coupling capacitors. However, in like fashion with the signal buffer 302, the first buffered VCO signal may be received at the terminals designated $In_p$ (non-inverted) and $In_n$ (inverted). Further, the second (differential) buffered VCO signal may then be provided by the signal buffer 304 at the output terminals designated $Out_p$ (non-inverted) and $Out_n$ (inverted).

The signal buffer 302 also can include p-type transistors 512, 514 and 522, n-type transistors 516 and 524 and resistors 516, 518, 524 and 526, which are used to disable the signal buffer 304 and prevent feed through of the first buffered VCO signal when, for example, wireless signals in a lower band are being communicated via the frequency divider 306, as has been previously described.

As shown in FIG. 5, the p-type transistors 512, 514 and 522 and the n-type transistors 516 and 524 may receive a power down signal (pd) or an inverted version of the power down signal ($\overline{pd}$) at their gate terminals. When pd is a digital '0' and $\overline{pd}$ is a digital '1', the signal buffer 304 is enabled and may receive the first buffered VCO signal from the signal buffer 302 and produce the second buffered VCO signal. When pd is a digital '1' and $\overline{pd}$ is a digital '0', the signal buffer 304 is disabled and a dc voltage is applied to the output terminals $Out_p$ (non-inverted) and $Out_n$ of the signal buffer 304. As described above, disabling the buffer 304 prevents feed through of the first buffered VCO signal when the transmitter is communicating wireless signals in a lower band wireless communication channel.

As noted above, when pd is a digital '0', the signal buffer 304 is enabled. For instance, when pd is '0', the p-type transistor 512 is on, which allows the high voltage power supply voltage VDD_HV to be applied to the load resistors 502 and 504. Also when pd is '0', $\overline{pd}$ is '1.' Accordingly the p-type transistors 514 and 522 and the n-type transistors 516,524 will all be off. Therefore, no voltage is applied to the resistors 516, 518, 526 and 528 and the second buffered VCO signal produced by the signal buffer 304 may be communicated via the output terminals $Out_p$ and $Out_n$ of the signal buffer 304.

When pd is a digital '1', the signal buffer is disabled. For instance, when pd is '1', the p-type transistor 512 is off. Accordingly, the high voltage power supply VDD_HV is not applied to the load resistors 502 and 504. Accordingly, the differential pair transistors 506 and 508 and the current source 510 would be unable to produce the second buffered VCO signal. Further, when pd is '1', $\overline{pd}$ is '0.' Accordingly, the p-type transistors 514 and 522 and the n-type transistors 516 and 524 will all be on. In this situation, VDD_HV is applied across the resistors 516 and 518, which act as a first resistor divider and the resistors 526,528, which act as second resistor dividers. The first and second resistor dividers then apply constant voltages (e.g., substantially the same voltage) to the output terminals $Out_p$ and $Out_n$.

In an example embodiment, the values of the resistors 516, 518, 524 and 526 may be selected such that the voltages generated by the resistor dividers (and applied to the output terminals $Out_p$ and $Out_n$) are below the threshold voltage of the input transistors (e.g., differential transistors pairs) of the buffer sections of the MUX/Buffer 308. Such an arrangement can prevent feed through of the first buffered VCO signal to the MUX/Buffer 308 when the transmitter 202 is communicating wireless signals in a lower band channel and also may reduce loading from the upper band differential transistor pairs of the buffer sections. It is noted that the frequency divider 306 may be disabled in substantially the same fashion as the signal buffer 304 when the transmitter 202 is communicating wireless signals in an upper band channel.

Figure 6:
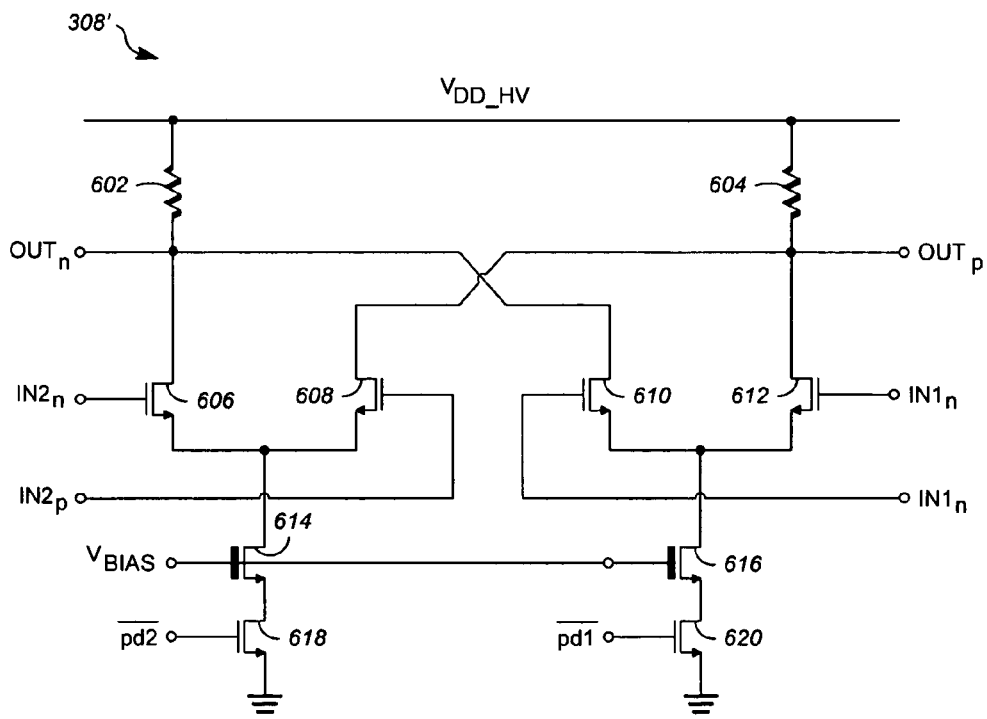
FIG. 6 is a is a circuit schematic of a single buffer section of the multiplexer of the LO generator illustrated in FIG. 3.

FIG. 6 is a schematic diagram illustrating an example buffer section 308' of the MUX/Buffer 308 of the LO generator 300. As with the signal buffers 302 and 304 illustrated in FIGS. 4 and 5, the circuit illustrated in FIG. 6 is merely given by way of example and other approaches for implementing the MUX/Buffer 308 may be used. In like fashion as the signal buffers 302 and 304 shown in FIGS. 4 and 5, the buffer section 308' can be powered by the high-voltage power supply (VDD_HV), such as may be provided by the high voltage bias generator 312 described with respect to FIG. 3.

The buffer section 308' can include load resistors 602 and 604 that are coupled to two differential transistor pairs. A first differential transistor pair including transistors 610,612 (e.g., deep N-well transistors) may be used to receive the divided VCO signal from the frequency divider 306 via input terminals $In1_p$ and $In1_n$. Likewise, a second differential transistor pair including transistors 606 and 608 (e.g., deep N-well transistors) may be used to receive the second buffered VCO signal from the signal buffer 304 via input terminals $In2_p$ and $In2_n$. As described above, the buffer section 308' may be designed with the same common mode voltage as the signal buffer 304 and the frequency divider 306. Accordingly, the buffer section 308' may not include input bias resistors or AC-coupling capacitors. The two differential transistor pairs each may be coupled with common output terminals Out$_p$ and Out$_n$ that may be used to communicate a selected (e.g., upper band or lower band) differential LO signal to a corresponding amplifier section of PAD 220.

Each of the differential transistor pairs of the buffer section 308' is coupled with a current source. The first differential pair may be coupled with the current source 620 and the second differential pair may be coupled with the current source 618. As with the other circuits described above, the current sources 618 and 620 may take the form of high-voltage transistors, though they are not so limited. In the buffer section 308', a bias voltage $V_{bias1}$ is applied to the gate terminals of the current sources 618 and 620. The bias voltage $V_{bias1}$ may be provided using any number of approaches, such as those described above.

The buffer section 308' also includes control transistors 618 and 620 that may receive a $\overline{pd2}$ signal and $\overline{pd1}$ signal, respectively. As was described above, each section of the MUX/Buffer may be disabled in part (e.g., dependent on whether an upper band or lower band channel is selected) or in whole (e.g., in accordance with power control in PAD 220) to prevent signal feed through in MUX/Buffer 308.

In a situation where an amplifier section in PAD 220 that is associated with the buffer section 308' is disabled in accordance with a given power control configuration, the signals $\overline{pd1}$ and $\overline{pd2}$ may both be '0.' In this situation, the current sources 614 and 616 would be unable to provide current to the first and second differential transistor pairs of the buffer section 308' and the buffer section 308' would be effectively disabled, thus preventing feed through of the second buffered VCO signal or the divided VCO signal to the disabled amplifier section.

In a situation where an amplifier section in PAD 220 that is associated with the buffer section 308' is enabled in accordance with a given power control configuration, it would then be desirable that a selected LO signal be communicated to the amplifier section. For instance, if lower band channel is selected, an LO signal based on the frequency divided VCO signal may be provided to the enabled amplifier section. In this situation, the signal $\overline{pd2}$ may be '0', while the signal $\overline{pd1}$ is '1.' This arrangement would allow current to be supplied by the current source 616 but would not allow current to be supplied by the current source 614. Therefore, only the first digital transistor pair (transistors 610 and 612) would be supplied with current. Accordingly, the buffer section 308' may generate a lower band LO signal based on the frequency divided VCO signal provided by the frequency divider 306, while preventing feed through of the second buffered VCO signal.

Additionally, as was described above, the signal buffer 304 may include circuitry to disable the signal buffer 304 and provide constant voltages on its output terminals that are below the threshold voltage of the transistors of the differential transistor pairs of the buffer section 308'. For instance, in the above situation (e.g., a lower band channel is selected), the signal buffer 304 may be disabled and a constant voltage that is below their threshold voltage may be applied to the gate terminals of the transistors 606 and 608 (e.g., via input terminals $In2_p$ and $In2_n$). This arrangement may further prevent feed through of the second buffered VCO signal to the enabled amplifier section when a lower band channel is selected and also reduce loading from the transistors 606 and 608.

Likewise, if an upper band channel is selected, it may be desirable to communicate an LO signal based on the second buffered VCO signal to the amplifier section. In this situation, the signal $\overline{pd2}$ may be '1', while the signal $\overline{pd1}$ is '0.' This would allow current to be supplied by the current source 614 but would not allow current to be supplied by the current source 616. Therefore, only the second digital transistor pair (i.e., transistors 606 and 608) would be supplied with current. Accordingly, the buffer section 308' may generate an upper band LO signal based on the second buffered VCO signal provided by the signal buffer 304, while preventing feed through of the second buffered VCO signal. As with the signal buffer 304, the frequency divider 306, in this situation, may be disabled and apply constant voltages, below their threshold voltage, to the gate terminals of the transistors 610 and 612 (e.g., via input terminals $In1_p$ and $In1_n$). This would further prevent feed through of the frequency divided VCO signal to the enabled amplifier section when a lower band channel is selected and reducing loading from transistors 610 and 612.

Example Method of Providing a Local Oscillator Signal

Figure 7:
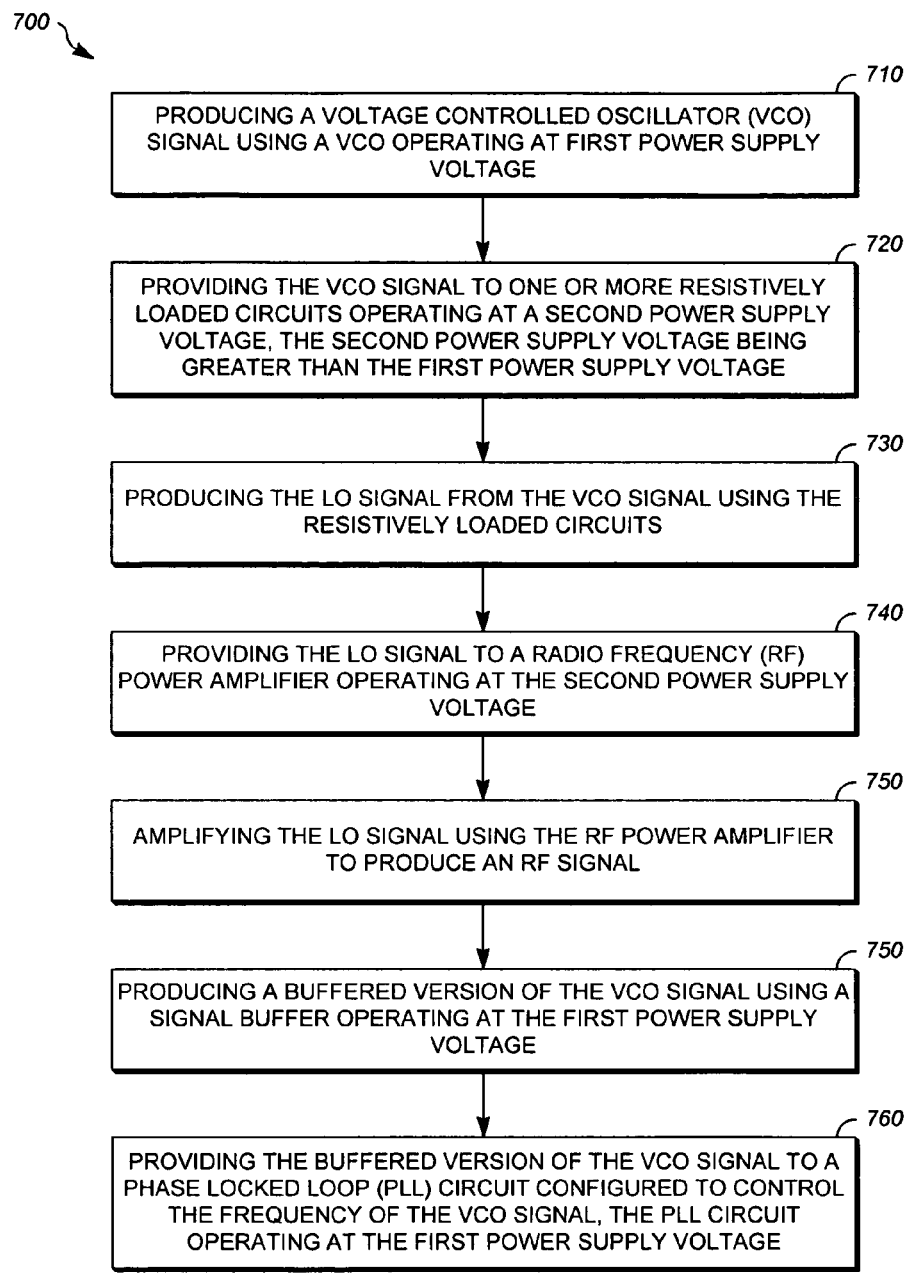
FIG. 7 is a flowchart illustrating a method of generating an LO signal.

FIG. 7 illustrates an example method 700 for generating a local oscillator signal. It will be appreciated that the steps of method 700 are given by way of example. In other embodiments, certain steps of the method 700 may be replaced, removed or other steps may be added.

The method 700 includes, at block 710, producing a voltage controlled oscillator (VCO) signal using a VCO operating at first power supply voltage. Such a VCO signal may be a differential signal and may be produced in conjunction with a PLL circuit, such as described above with reference to FIGS. 2 and 3. At block 720, the method 700 includes providing the VCO signal to one or more resistively loaded circuits operating at a second power supply voltage, where the second power supply voltage is greater than the first power supply voltage. The resistively loaded circuits may include the circuits described above with respect to FIGS. 2-6. Alternatively, other resistively loaded circuits may be used. As was also described above, the first power supply voltage and the second power supply voltage may be produced using respective first and second bias generators, such as the bias generators 310 and 312 illustrated in FIG. 3. The method 700, at block 730, then includes producing the LO signal from the VCO signal using the resistively loaded circuits. The LO signal may be selectively produced in similar fashion as was described above with respect to FIGS. 2-6, for example.

The example method 700 further includes, at block 740, providing the LO signal to a radio frequency (RF) power amplifier (e.g., PAD 220) operating at the second power supply voltage and, at block 750, amplifying the LO signal using the RF power amplifier to produce an RF signal. As was discussed above, the RF signal may be produced using weighted amplifier sections of an RF power amplifier, such as PAD 220, where the amplifier sections are enabled and/or disabled in accordance with a given power control configuration.

At block 760, the method 700 still further includes producing a buffered version of the VCO signal using a signal buffer (e.g., signal buffer 216) operating at the first power supply voltage and, at block 770, providing the buffered version of the VCO signal to a phase locked loop (PLL) circuit (e.g., PLL 212) configured to control the frequency of the VCO signal, where the PLL circuit operates at the first power supply voltage.

Other Implementations

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

What is claimed is:

1. A circuit for providing a local oscillator (LO) signal, the circuit comprising:
   a voltage controlled oscillator (VCO) configured to (i) operate at a first supply voltage and (ii) produce a VCO signal;
   an LO generator coupled with the VCO so as to receive the VCO signal, the LO generator being configured to operate at a second supply voltage, the second supply voltage being greater than the first supply voltage, the LO generator comprising one or more resistively loaded circuits for producing the LO signal from the VCO signal; and
   a resistively loaded signal buffer coupled with the VCO so as to receive the VCO signal, the resistively loaded signal buffer configured to (i) operate at the first supply voltage and (ii) provide a buffered VCO signal to a phase locked loop (PLL) circuit.

2. The circuit of claim 1, wherein the PLL circuit is configured to operate at the first supply voltage.

3. The circuit of claim 1, wherein the resistively loaded signal buffer is AC-coupled with the VCO.

4. The circuit of claim 1, wherein the VCO signal and the LO signal comprise differential signals and the one or more resistively loaded circuits are differential circuits.

5. The circuit of claim 1, further comprising:
   a first bias generator configured to produce the first supply voltage; and
   a second bias generator configured to produce the second supply voltage.

6. A circuit for providing a local oscillator (LO) signal, the circuit comprising:
   a voltage controlled oscillator (VCO) configured to (i) operate at a first supply voltage and (ii) produce a VCO signal;
   an LO generator coupled with the VCO so as to receive the VCO signal, the LO generator being configured to operate at a second supply voltage, the second supply voltage being greater than the first supply voltage, the LO generator comprising one or more resistively loaded circuits for producing the LO signal from the VCO signal;
   a first resistively loaded signal buffer that is AC-coupled with the VCO, the first resistively loaded signal buffer being configured to (i) receive the VCO signal and (ii) produce a first buffered VCO signal;
   a second resistively loaded signal buffer coupled with the first resistively loaded signal buffer, the second resistively loaded signal buffer being configured to (i) receive the first buffered VCO signal and (ii) produce a second buffered VCO signal;
   a resistively loaded frequency divider coupled with the first resistively loaded signal buffer, the resistively loaded frequency divider being configured to (i) receive the first buffered VCO signal and (ii) produce a frequency divided VCO signal; and
   a resistively loaded multiplexer coupled with (i) the second resistively loaded signal buffer and (ii) the resistively loaded frequency divider, the resistively loaded multiplexer configured to:
      receive the second buffered VCO signal; and
      receive the frequency divided VCO signal,
   wherein the multiplexer is configured to selectively produce one of a high-frequency LO signal and a low-frequency LO signal based on a selected one of the second buffered VCO signal and the frequency divided VCO signal.

7. The circuit of claim 6, wherein the second signal buffer and the frequency divider each comprises circuitry configured to selectively individually enable or disable the second signal buffer and the frequency divider.

8. The circuit of claim 6, further comprising a radio-frequency (RF) power amplifier coupled with the resistively loaded multiplexer, the RF power amplifier being configured to (i) receive the selected LO signal and (ii) amplify the selected LO signal.

9. The circuit of claim 8, wherein the resistively loaded multiplexer comprises a plurality of buffer sections configured to provide the selected LO signal to the RF power amplifier, and wherein the RF power amplifier comprises a plurality of amplifier sections configured to amplify the selected LO signal, each of the plurality of buffer sections including circuitry configured to individually selectively enable or disable the buffer sections.

10. The circuit of claim 9, wherein the sections of the RF power amplifier are binary weighted sections.

11. A method of producing a local oscillator (LO) signal, the method comprising:
    producing a voltage controlled oscillator (VCO) signal using a VCO operating at first power supply voltage;
    providing the VCO signal to one or more resistively loaded circuits operating at a second power supply voltage, the second power supply voltage being greater than the first power supply voltage; and
    producing the LO signal from the VCO signal using the resistively loaded circuits,
    wherein the VCO signal and the LO signal are differential signals.

12. The method of claim 11, further comprising:
    providing the LO signal to a radio frequency (RF) power amplifier operating at the second power supply voltage; and
    amplifying the LO signal using the RF power amplifier to produce an RF signal.

13. The method of claim 11, further comprising:
    producing a buffered version of the VCO signal using a signal buffer operating at the first power supply voltage; and
    providing the buffered version of the VCO signal to a phase locked loop (PLL) circuit configured to control a frequency of the VCO signal, the PLL circuit operating at the first power supply voltage.

14. The method of claim 11, wherein providing the VCO signal to the one or more resistively loaded circuits and producing the LO signal from the VCO signal comprises:
    providing the VCO signal to a first resistively loaded signal buffer;
    producing a first buffered VCO signal using the first resistively loaded signal buffer;
    providing the first buffered VCO signal to a second resistively loaded signal buffer and a resistively loaded frequency divider;
    selectively producing one of (i) a second buffered VCO signal using the second resistively loaded signal buffer and (ii) a frequency divided VCO signal using the resistively loaded frequency divider;
    providing the selected one of the second buffered VCO signal and the frequency divided VCO signal to a resistively loaded multiplexer; and producing the LO signal from the selected one of the second buffered VCO signal and the frequency divided VCO signal.

15. The method of claim 14, wherein producing the LO signal using the multiplexer comprises producing the LO signal using a plurality of buffer sections of the multiplexer.

16. The method of claim 11, further comprising:
producing the first supply voltage using a first bias generator; and
producing the second supply voltage using a second bias generator.

17. A circuit for producing a local oscillator signal, the circuit comprising:
a voltage controlled oscillator (VCO) configured to (i) operate at a first supply voltage and (ii) produce a VCO signal; and
an LO generator coupled with the VCO so as to receive the VCO signal, the LO generator configured to (i) operate at a second supply voltage, the second supply voltage being greater than the first supply voltage and (ii) produce the LO signal from the VCO signal, wherein the LO generator comprises:
a first resistively loaded signal buffer that is AC-coupled with the VCO, the first resistively loaded signal buffer being configured to (i) receive the VCO signal and (ii) produce a first buffered VCO signal;
a second resistively loaded signal buffer coupled with the first resistively loaded signal buffer, the second resistively loaded signal buffer being configured to (i) receive the first buffered VCO signal and (ii) produce a second buffered VCO signal;
a resistively loaded frequency divider coupled with the first resistively loaded signal buffer, the resistively loaded frequency divider being configured to (i) receive the first buffered VCO signal and (ii) produce a frequency divided VCO signal; and
a resistively loaded multiplexer coupled with (i) the second resistively loaded signal buffer and (ii) the resistively loaded frequency divider, the resistively loaded multiplexer configured to:
receive the second buffered VCO signal; and
receive the frequency divided VCO signal,
wherein the multiplexer is configured to selectively produce one of a high-frequency LO signal and a low-frequency LO signal based on a selected one of the second buffered VCO signal and the frequency divided VCO signal.

18. The circuit of claim 17, wherein the second signal buffer and the frequency divider each comprise circuitry configured to selectively individually enable or disable the second signal buffer and the frequency divider.

* * * * *